United States Patent
Dhaene et al.

(10) Patent No.: US 8,145,453 B2
(45) Date of Patent: Mar. 27, 2012

(54) BROADBAND TRANSFER FUNCTION SYNTHESIS USING ORTHONORMAL RATIONAL BASES

(75) Inventors: Tom Dhaene, Deinze (BE); Dirk Deschrijver, Oudenaade (BE); Bart Haegeman, Antwerpen (BE)

(73) Assignee: Agilent Technologies, Inc., Santa Clara, CA (US)

( * ) Notice: Subject to any disclaimer, the term of this patent is extended or adjusted under 35 U.S.C. 154(b) by 1680 days.

(21) Appl. No.: 11/409,300

(22) Filed: Apr. 21, 2006

(65) Prior Publication Data

US 2007/0250559 A1     Oct. 25, 2007

(30) Foreign Application Priority Data

Apr. 20, 2006    (GB) .................................. 0607730.9

(51) Int. Cl.
*G06F 17/10*    (2006.01)
(52) U.S. Cl. .......................................................... 703/2
(58) Field of Classification Search ........................ 703/2
See application file for complete search history.

(56) References Cited

OTHER PUBLICATIONS

Dhaene et al., Generalised vector fitting algorithm for macromodelling of passive electronic components; Electronics Letters Mar. 17, 2005 vol. 41 No. 6; pp. 1-2.*
Deschrijver et al., Broadband macromodelling of passive components using orthonormal vector fitting; Electronics Letters Oct. 13, 2005 vol. 41 No. 21; pp. 1-2.*

* cited by examiner

*Primary Examiner* — Hugh Jones

(57) ABSTRACT

In order to generate a broadband transfer function of complex characteristics of a linear time-invariant (LTI) system, data characterising properties of the system are acquired. A set of poles in the complex plane are defined to characterize the system, and then an iterative process is performed to: define a set of orthonormal rational basis functions incorporating the defined poles, use the orthonormal rational basis functions to estimate transfer function coefficients, and derive revised values for the complex poles, until a desired level of accuracy of the transfer function coefficients is attained. The revised complex poles are used to determine parameters of the broadband transfer function.

11 Claims, 5 Drawing Sheets

BROADBAND TRANSFER FUNCTION SYNTHESIS USING ORTHONORMAL RATIONAL BASES

This invention relates to broadband transfer function synthesis, and particularly though not exclusively to methods and apparatus of approximating electro-magnetic behaviour, for example in the frequency domain, of physical structures such as multi-port systems.

BACKGROUND

The use of system transient (or circuit) simulation techniques to design and analyse complex dynamic systems, incorporating mathematical descriptions of the characteristics of component parts of the systems, has become increasingly widespread. Examples include automotive and aerospace products, and electronic products such as mobile telephones and domestic receivers for satellite TV transmissions. As the typical frequency of operation of such products increases it is becoming increasingly important to include the electro-magnetic (EM) behaviour of complex physical structures, such as electronic packages of passive components, in the transient simulation. Such simulation involves for example accurate frequency-domain or time-domain macro-models of the physical structures. These macro-models are analytic expressions of system transfer functions, and approximate the complex EM behaviour of high-speed multi-port systems at the input and output ports in the frequency or time domains by rational functions (i.e. expressions involving the ratio of two functions).

Rational least-squares approximation is essentially a non-linear problem (a problem which is non-linear in terms of the unknowns), so it is often difficult to estimate the system parameters in a fast and accurate manner. Past proposals have attempted to avoid this difficulty by assuming that knowledge about the poles (denominator of the approximation function) is available. In this case, the non-linear problem reduces to a linear problem since the denominator parameters are assumed to be known. In practice, however, this assumption is often not realistic. Rational linear least-squares approximation techniques are known to suffer from poor numerical conditioning if the frequency range is rather broad, or when the macro-model requires a large number of mathematical poles to provide an adequate representation.

Another possible option is the use of non-linear optimization techniques, such as Newton-Gauss type algorithms. This approach is computationally not always efficient, and the solutions may converge to local minima (leading to suboptimal results), even when Levenberg-Marquardt algorithms are used to extend the region of convergence.

Another proposal was to minimize a Kalman- (or Levi-) linearized cost function which is non-quadratic in the system parameters. This formulation involves setting a weighting factor equal to one for all frequencies. This weighting biases the fitted transfer function, and this often results in poor low-frequency fits, due to an undesired overemphasis of high-frequency errors.

The accuracy of rational least-squares approximation and its numerical conditioning are highly dependent on the structure of the system of equations that is set up as part of the procedure. This procedure includes the choice of "basis functions" from which the numerator and the denominator of the rational expression are assembled. If these basis functions are chosen to be a monomial power series basis $(1, s, s^2, \ldots)$ for example, a matrix will result which is a Vandermonde matrix, which is notoriously ill-conditioned. Another proposal is the use as basis functions of polynomials which are orthogonal with respect to a continuous inner product, such as Chebyshev polynomials. The large variation of the Chebyshev polynomials with increase in order makes it possible to downsize the effects of ill-conditioning. A further proposal involves the use of Forsythe polynomials which are orthonormal with respect to a discrete inner product, defined by the normal equations of the estimator. This implies that a different set of basis functions is used for numerator and denominator. It has been shown that the Forsythe polynomial basis is optimal in a sense that there does not exist any other polynomial basis resulting in a better conditioned form of the normal equations.

An iterative macro-modelling technique is described in "Rational Approximation of Frequency Domain Responses by Vector Fitting", B. Gustavsen and A. Semlyen, *IEEE Transactions on Power Delivery*, 14 (3), pp. 1052-1061, July 1999. This technique, called Vector Fitting (VF), is basically a reformulation of Sanathanan-Koerner (SK-) iteration ("Transfer Function Synthesis as a Ratio of Two Complex Polynomials", C. K. Sanathanan and J. Koerner, *IEEE Transactions on Automatic Control*, AC-8, pp. 56-58, January 1963) using partial fraction basis functions rather than polynomial basis functions. Initially, the poles of partial fractions are prescribed, and they are relocated in successive iterations until a predetermined "cost function" is minimized. The robustness of the method is mainly due to the use of rational basis functions instead of polynomials, which are numerically advantageous if the prescribed poles are properly chosen. This method has been applied in various contexts, such as power systems and microwave engineering. If the prescribed poles are well chosen, the associated system equations are often well-conditioned. For example, the poles may be selected as complex conjugate pairs on a vertical or skew line, close to the imaginary axis of the complex plane. Owing to the iterative behaviour of the SK-iteration, the prescribed poles are relocated until the poles converge in such way that the SK cost function is converged. In general, this happens with relatively few iterations. Vector fitting has been widely applied to many modelling problems in power systems, high-speed interconnection structures, electronic packages and microwave systems.

SUMMARY OF THE DISCLOSED EMBODIMENTS

According to one aspect of this invention there is provided a method of generating a broadband transfer function of complex characteristics of a linear time-invariant (LTI) system, comprising:

acquiring data characterising properties of the system;

defining a set of poles in the complex plane to characterise the system;

iteratively defining a set of orthonormal rational basis functions incorporating the defined poles, using the orthonormal rational basis functions to estimate transfer function coefficients, and deriving revised values for the complex poles, until a desired level of accuracy of the transfer function coefficients is attained; and using the revised complex poles to determine parameters of the broadband transfer function.

According to another aspect of this invention there is provided an apparatus for generating a broadband transfer function of complex characteristics of a linear time-invariant (LTI) system, comprising:

a data acquirer for acquiring data characterising properties of the system;

a pole definer for defining a set of poles in the complex plane to characterise the system;

an iterator for iteratively defining a set of orthonormal rational basis functions incorporating the defined poles, using the orthonormal rational basis functions to estimate transfer function coefficients, and deriving revised values for the complex poles, until a desired level of accuracy of the transfer function coefficients is attained; and a parameter deriver for using the revised complex poles to determine parameters of the broadband transfer function.

Generation of broadband transfer functions according to the invention is numerically more robust than with the VF algorithm. The use of orthonormal rational functions makes the system equations significantly better conditioned, especially when the initial poles are not chosen in an optimal way. As the poles are identified more accurately, fewer iterations are needed, and the overall macro-modelling time can be reduced. The computational complexity the invention is approximately the same per iteration as for the VF method. Once the rational transfer function/macro-model is identified, it can for example be represented in state-space format, and can easily be converted to a SPICE (Simulation Program with Integrated Circuit Emphasis) or EMTP (Electromagnetic Transients Program) circuit.

BRIEF DESCRIPTION OF THE DRAWINGS

A method and apparatus in accordance with this invention, for synthesising broadband transfer functions, will now be described, by way of example, with reference to the accompanying drawings, in which.

DETAILED DESCRIPTION

The invention facilitates macro-modelling to identify a mapping, in the form of an analytic model, between inputs and outputs of a complex linear time-invariant (LTI) system. A linear system is one to which the principle of superposition applies, i.e. the output of the system in response to two different stimuli applied simultaneously is equal to the sum of the system outputs in response to the two stimuli applied individually. Thus if:

$$x_1 \rightarrow y_1 \text{ and } x_2 \rightarrow y_2$$

where $x_1$ and $x_2$ are system inputs, $y_1$ and $y_2$ are the system outputs, and $\rightarrow$ indicates "results in the response", then in a linear system:

$$ax_1 + bx_2 \rightarrow ay_1 + by_2$$

where a and b are arbitrary constants.

A system is time-invariant if time shifts in the input signal produce equal time shifts in the output signal. Thus if:

$$x(t) \rightarrow y(t)$$

then in a time-invariant system, for any time shift $t_0$:

$$x(t-t_0) \rightarrow y(t-t_0)$$

Examples of LTI systems are found in a variety of disciplines: electronic circuits such as satellite microwave receivers, radio-frequency and microwave circuits; mechanical systems such as oscillators (e.g. vehicle suspensions and other sprung systems) and disk drives; electrical power systems, such as transformers; computer systems; biological systems; and economic systems.

Figure 1:
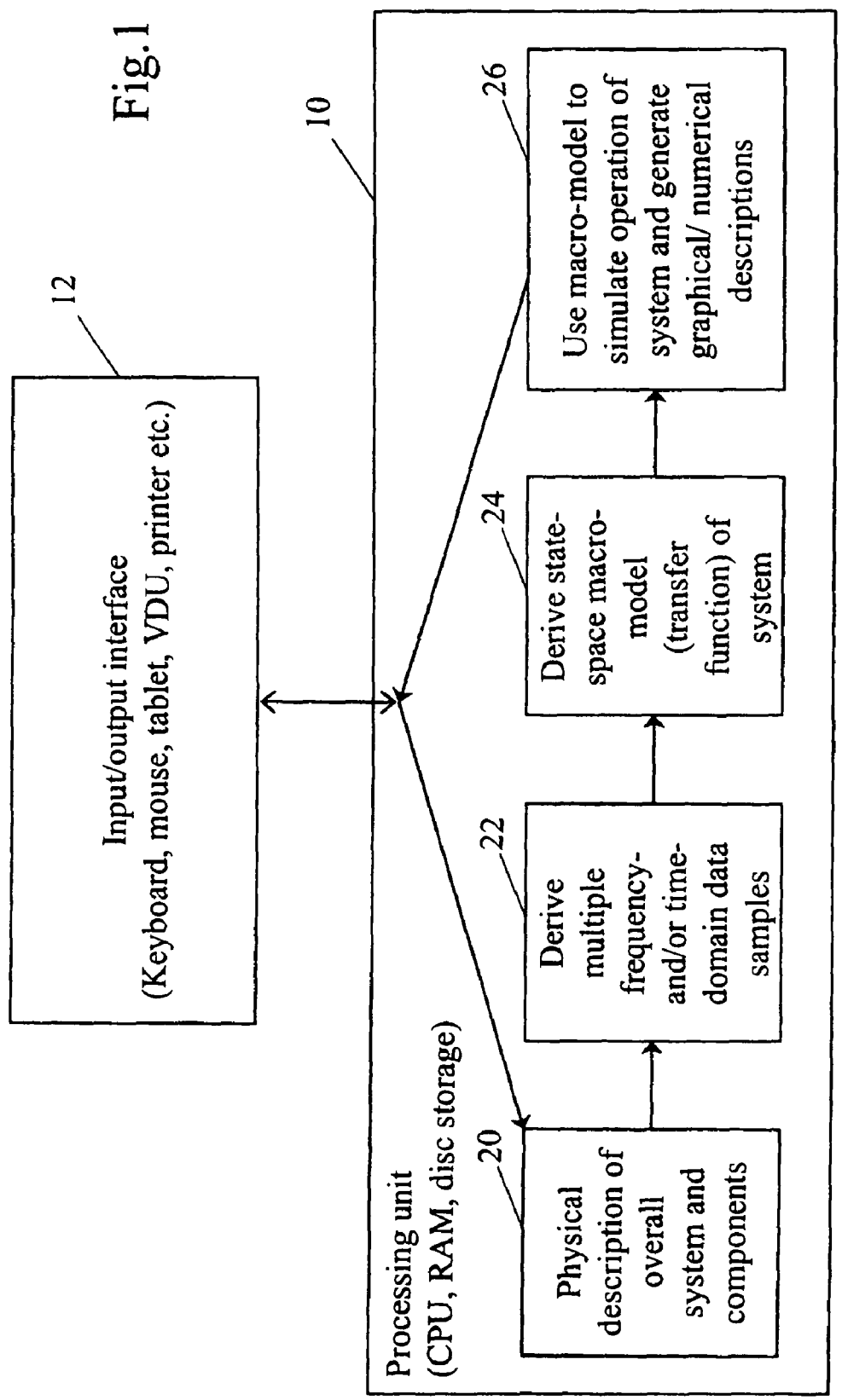
FIG. 1 is a block diagram of apparatus for simulating operation of an LTI system using the present invention.

For convenience an example implementation of the invention will be described below in the context of electronic circuit design, using apparatus as shown in FIG. 1 for simulating operation of an electronic circuit. However, the invention is equally applicable to simulating the operation of any other kind of LTI system, including those mentioned above.

Referring to FIG. 1, the apparatus comprises a processing unit 10 and a user input/output interface unit 12. The processing unit 10 includes a central processing unit (CPU), random-access memory (RAM), hard disc storage and associated circuitry to enable the CPU to implement procedures in accordance with software program instructions stored in the RAM, and to interact with the interface unit 12 to receive input from the user and display the results of the procedures. The interface unit 12 typically comprises a visual-display unit (VDU), keyboard, mouse and/or tablet or similar pointing device, and a printer or other hard-copy output device.

In preparing to perform a system simulation, the apparatus receives, via the interface unit 12, a physical description of the system at stage 20, for example a list of components of an electronic circuit, their operating characteristics (e.g. resistance, capacitance, gain as a function of frequency, etc.), their interconnection and other details of the circuit layout. At stage 22 a set of data samples, characterising the system in either the frequency domain or the time domain as appropriate, are obtained and supplied to the system. These sample may be obtained, for example, by measurements made with a network analyzer (NWA) or a time-domain reflectometer (TDR). At stage 24 the apparatus derives a macro-model of the system's electromagnetic behaviour, that approximates the measured data to a desired degree of precision and accuracy. This model may conveniently be in state-space format, comprising (in generalised terms): a state equation of the form $$x' = Ax + Bu$$

where x' (bold type indicates a matrix or vector) is the derivative of the system's state vector with respect to time, A is the system matrix, B is the input matrix and u is the input; and an output equation of the form $$y = Cx + Du$$

where y is the output, C is the output matrix, and D is the feedforward term.

At stage 26 the state-space macro-model is used to characterise the electromagnetic properties and operation of the system and generate numerical and/or graphical descriptions, such as frequency responses and transfer functions.

For continuous-time LTI systems in the frequency domain, identifying the required mapping or analytic model involves finding a rational transfer function R(s) which approximates the spectral response of a system over some predefined frequency range of interest $[f_{min}, f_{max}]$. The spectral response of the system is characterised by a set of frequency-domain data samples $(s_k, H(s_k))$, for all k in the range 0 to K, which can be obtained from observations, such as measurements or circuit simulations. In many situations the quantity of available data samples is quite numerous, so numerically-stable fitting techniques are desirable which estimate the model coefficients in a least-squares sense.

In the technique described below, the numerator N(s) and denominator D(s) of the transfer function R(s) are represented as a linear combination of P orthonormal rational basis functions $\phi_p(s)$:

$$R(s) = \frac{N(s)}{D(s)} = \frac{\sum_{p=1}^{P} c_p \phi_p(s)}{\tilde{c}_0 + \sum_{p=1}^{P} \tilde{c}_p \phi_p(s)} \quad s = i2\pi f \quad (1)$$

where the coefficients $c_p$ and $\tilde{c}_p$ represent the model coefficients and P is the number of poles used in defining the basis functions (as described below). Additional polynomial terms can be added to N(s) in order to vary the model order as required. The denominator has an additional basis function $(\phi_0(s))$, with coefficient $\tilde{c}_0$; this basis function is set equal to the constant value 1 to obtain an unambiguous solution. Orthonormal functions have the property that the constituent functions are mutually orthogonal and of magnitude 1 (referred to as "normal"), with respect to some predefined inner product. The orthonormal basis functions are chosen in a manner to improve the numerical robustness of the fitting procedure. Given a set of Laplace-domain data samples $(s_k, H(s_k))$, the objective of the macro-modelling procedure is to identify values for the coefficients $c_p, \tilde{c}_p$, such that the transfer function matches the data in a least squares sense, i.e. $R(s_k) \approx H(s_k)$, for $k=0, \ldots, K$.

The basis functions are defined in terms of the samples s and a prescribed set of complex poles $a=\{-a_1, \ldots, -a_p\}$ (a pole of a complex function $f(s)$ is a point $s=-a_p$ such that $f(s)$ approaches infinity as s approaches $-a_p$). For cases where the pole $-a_p$ is real, the basis functions $\phi_p(s,a)$ are defined as $$\phi_p(s_k, a) = \frac{\kappa_p \sqrt{2\text{Re}(a_p)}}{s_k + a_p} \left( \prod_{j=1}^{p-1} \frac{s_k - a_j^*}{s_k + a_j} \right) \quad (2)$$

where $\kappa_p$ is an arbitrary unimodular complex number (a complex number with magnitude equal to 1), Re represents the real part of a complex value, k is the index through the data samples, j is a regular index variable and the star-operator (*) denotes the complex conjugate of a given value.

For cases where the pole $-a_p = -a^*_{p+1}$ the basis functions are defined as $$\phi_p(s_k, a) = \frac{\left(\sqrt{2\text{Re}(a_p)}\right)(s_k - |a_p|)}{((s_k + a_p)(s_k + a_{p+1}))} \left( \prod_{j=1}^{p-1} \frac{(s_k - a_j^*)}{(s_k + a_j)} \right) \quad (3)$$

and $$\phi_{p+1}(s_k, a) = \frac{\left(\sqrt{2\text{Re}(a_p)}\right)(s_k + |a_p|)}{((s_k + a_p)(s_k + a_{p+1}))} \left( \prod_{j=1}^{p-1} \frac{(s_k - a_j^*)}{(s_k + a_j)} \right) \quad (4)$$

where $|a_p|$ represents the absolute value of the complex value $a_p$.

It can be shown that the basis functions defined in expressions (2), (3) and (4) are orthonormal with respect to the following inner product ($1 \leq m, n \leq P$)

$$\langle \phi_m(s), \phi_n(s) \rangle = \frac{1}{2\pi i} \int_{i\mathbb{R}} \phi_m(s) \phi_n^*(s) \, ds = \delta_{mn} \quad (5)$$

[The inner product defines the orthonormality, as described above.]

The coefficients of the transfer function R(s) are estimated by minimizing the following "cost function" $E_{NL}$ $$E_{NL} = \sum_{k=0}^{K} \left| H(s_k) - \frac{N(s_k)}{D(s_k)} \right|^2 \quad (6)$$

which is non-linear in terms of $c_p$ and $\tilde{c}_p$. One possible way to solve this non-linear problem efficiently is the use of a Sanathanan-Koerner iteration. Based on the set of prescribed poles (expressions (2), or (3) and (4)), the following cost function $E_{SK}$ is minimized in consecutive iteration steps ($t=1, \ldots, T$):

$$E_{SK} = \sum_{k=0}^{K} \frac{1}{|D^{(t-1)}(s_k)|^2} |N^{(t)}(s_k) - D^{(t)}(s_k) H(s_k)|^2 \quad (7)$$

In the first iteration step $t=1$, $D^{(0)}(s_k)$ equals unity.

The numerator and the denominator of expression (7) are factorized as follows:

$$N^{(t)}(s) = \sum_{p=1}^{P} c_p^{(t)} \phi_p(s, a) = \frac{\prod_{p=1}^{P-1} (s + z_{p,n}^{(t)})}{\prod_{p=1}^{P} (s + a_p)} \quad (8)$$

where the array of zeroes $z^{(t)}_n = \{-z^{(t)}_{1,n}, \ldots, -z^{(t)}_{P-z,n}\}$ are zeroes of $N^{(t)}(s)$ and $$D^{(t)}(s) = \tilde{c}_0 + \sum_{p=1}^{P} \tilde{c}_p^{(t)} \phi_p(s, a) = \frac{\prod_{p=1}^{P} (s + z_{p,d}^{(t)})}{\prod_{p=1}^{P} (s + a_p)} \quad (9)$$

where the array of zeroes $z^{(t)}_d = \{-z^{(t)}_{1,d}, \ldots, -z^{(t)}_{P,d}\}$ are zeroes of $D^{(t)}(s)$.

Then the cost function $E_{SK}$ resolves to the following form $$E_{SK} = \sum_{k=0}^{K} \left| \frac{\prod_{p=1}^{P}(s_k + a_p)}{\prod_{p=1}^{P}(s_k + z_{p,d}^{(t-1)})} \right|^2 \left| \frac{\prod_{p=1}^{P-1}(s_k + z_{p,n}^{(t)})}{\prod_{p=1}^{P}(s_k + a_p)} - \left( \frac{\prod_{p=1}^{P}(s_k + z_{p,d}^{(t)})}{\prod_{p=1}^{P}(s_k + a_p)} \right) H(s_k) \right|^2 \quad (10)$$

$$= \sum_{k=0}^{K} \left| \frac{\prod_{p=1}^{P-1}(s_k + z_{p,n}^{(t)})}{\prod_{p=1}^{P}(s_k + z_{p,d}^{(t-1)})} - \left( \frac{\prod_{p=1}^{P}(s_k + z_{p,d}^{(t)})}{\prod_{p=1}^{P}(s_k + z_{p,d}^{(t-1)})} \right) H(s_k) \right|^2 \quad (11)$$

$$= \sum_{k=0}^{K} \left| \sum_{p=1}^{P} d_p^{(t)} \phi_p(s_k, z_d^{(t-1)}) - \left( \tilde{d}_0^{(t)} + \sum_{p=1}^{P} \tilde{d}_p^{(t)} \phi_p(s_k, z_d^{(t-1)}) \right) H(s_k) \right|^2 \quad (12)$$

The unknown coefficients $d_p^{(t)}$ and $\tilde{d}_p^{(t)}$ are calculated in order to minimize $E_{SK}$, by solving the following set of least squares equations ($\tilde{d}_0^{(t)}$ is fixed to unity to avoid a trivial null solution):

$$\sum_{p=1}^{P} d_p^{(t)} \phi_p(s_k, z_d^{(t-1)}) - \left( \sum_{p=1}^{P} \tilde{d}_p^{(t)} \phi_p(s_k, z_d^{(t-1)}) \right) H(s_k) = H(s_k) \quad (13)$$

The zeroes $z_d^{(t)}$ are calculated by solving the eigenvalues eig(A−B*C), where A, B and C are matrices obtained from the state-space representation of $D^{(t)}(s)/D^{(t-1)}(s)$, as described in more detail below.

Since the values of $d_p^{(t)}$ and $\tilde{d}_p^{(t)}$ have now been derived, $R^{(t)}(s)$ can be written as $$R^{(t)}(s) = \frac{(N^{(t)}(s)/D^{(t-1)}(s))}{(D^{(t)}(s)/D^{(t-1)}(s))} = \frac{\sum_{p=1}^{P} d_p^{(t)} \phi_p(s, z_d^{(t-1)})}{1 + \sum_{p=1}^{P} \tilde{d}_p^{(t)} \phi_p(s, z_d^{(t-1)})} \quad (14)$$

$$= \frac{\prod_{p=1}^{P-1}(s + z_{p,n}^{(t)})}{\prod_{p=1}^{P}(s + z_{p,d}^{(t-1)})} \frac{\prod_{p=1}^{P}(s + z_{p,d}^{(t-1)})}{\prod_{p=1}^{P}(s + z_{p,d}^{(t)})} = \frac{\prod_{p=1}^{P-1}(s_k + z_{p,n}^{(t)})}{\prod_{p=1}^{P}(s_k + z_{p,d}^{(t)})} \quad (15)$$

Therefore the poles of the transfer function $R^{(t)}(s)$ are basically the zeroes $z_d^{(t)}$. This process is repeated iteratively, for t=1, . . . , T, until the values of $-z_{p,d}^{(t)}$ (=poles of the transfer function) and $-z_{p,n}^{(t)}$ (=zeroes of the transfer function) are converged. Unstable poles are flipped into the left half-plane (left-hand half of the complex plane, LHP) before each iteration.

After convergence (i.e. after the final iteration for t=T), the transfer function can be rewritten as a linear combination of orthonormal rational functions which are based on the identified poles $-z_{p,d}^{(T)}$:

$$R(s) = \sum_{p=1}^{P} \alpha_p^{(T)} \phi_p(s, z_d^{(T)}) \quad (16)$$

The coefficients $a_p^{(T)}$ of R(s) are estimated by solving the following linear problem to determine the residues, in the case where it is desired that identified poles should be stable:

$$\arg\min_{\alpha} \sum_{k=0}^{K} \left| H(s_k) - \sum_{p=1}^{P} \alpha_p^{(T)} \phi_p(s_k, z_d^{(T)}) \right|^2 \quad (17)$$

If unstable poles are acceptable, the residues can be identified in a basis of partial fractions:

$$\arg\min_{\alpha} \sum_{k=0}^{K} \left| H(s_k) - \sum_{p=1}^{P} \frac{\alpha_p^{(T)}}{s_k + z_{p,d}^{(T)}} \right|^2 \quad (18)$$

Both expressions (17) and (18) can be readily expressed in state-space format.

The eigenvalues eig(A−B*C) mentioned above in relation to expression (14) are solved as follows. The minimal continuous-time LTI state-space representation is $$sX(s) = AX(s) + BU(s) \quad (19)$$

$$Y(s) = CX(s) + DU(s) \quad (20)$$

for the denominator $$D^{(t)}(s)/D^{(t-1)}(s) = 1 + \sum_{p=1}^{P} \tilde{d}_p^{(t)} \phi_p(s_k, z_d^{(t-1)}) \quad (21)$$

The state-space expressions (19), (20) are calculated by cascading the minimal state-space representation of smaller, first and second order sections:

$$\frac{s-(z_{1,d}^{(t-1)})^*}{s+z_{1,d}^{(t-1)}} \to \frac{s-(z_{2,d}^{(t-1)})^*}{s+z_{2,d}^{(t-1)}} \to \ldots \to \frac{s-(z_{P-1,d}^{(t-1)})^*}{s+z_{P-1,d}^{(t-1)}} \to \frac{1}{s+z_{P,d}^{(t-1)}} \quad (22)$$

The minimal state-space version of the compound system (22) is in turn obtained as the cascade construction of smaller state-space models, with $y_p(t)=u_{p+1}(t)$.

The state matrix A and the input vector B are built such that the states contain exactly the unnormalized basis functions. The output vector C and scalar D are chosen to obtain the denominator expression (21), by compensating for the coefficients $\tilde{d}_p^{(t)}$ and normalization constant $\sqrt{2\mathrm{Re}(z^{(t-1)}_{p,d})}$ in the vector C, and setting the scalar D equal to the constant value 1. The following real-valued state-space expression is obtained, provided that the poles $-z^{(t-1)}_{p,d}$ are real:

$$A_{P\times P} = \begin{bmatrix} -z_{1,d}^{(t-1)} & 0 & 0 & \cdots & 0 \\ 2\mathrm{Re}(-z_{1,d}^{(t-1)}) & -z_{2,d}^{(t-1)} & 0 & \cdots & 0 \\ 2\mathrm{Re}(-z_{1,d}^{(t-1)}) & 2\mathrm{Re}(-z_{2,d}^{(t-1)}) & -z_{3,d}^{(t-1)} & \cdots & 0 \\ 2\mathrm{Re}(-z_{1,d}^{(t-1)}) & 2\mathrm{Re}(-z_{2,d}^{(t-1)}) & 2\mathrm{Re}(-z_{3,d}^{(t-1)}) & \cdots & 0 \\ \cdots & \cdots & \cdots & \cdots & \cdots \\ 2\mathrm{Re}(-z_{1,d}^{(t-1)}) & 2\mathrm{Re}(-z_{2,d}^{(t-1)}) & 2\mathrm{Re}(-z_{3,d}^{(t-1)}) & \cdots & -z_{P,d}^{(t-1)} \end{bmatrix} \quad (23)$$

$$B_{1\times P} = \begin{bmatrix} 1 \\ 1 \\ \cdots \\ 1 \end{bmatrix}, \quad C_{P\times 1} = \begin{bmatrix} \tilde{d}_1^{(t)} \sqrt{2\mathrm{Re}(z_{1,d}^{(t-1)})} \\ \tilde{d}_2^{(t)} \sqrt{2\mathrm{Re}(z_{2,d}^{(t-1)})} \\ \cdots \\ \tilde{d}_P^{(t)} \sqrt{2\mathrm{Re}(z_{P,d}^{(t-1)})} \end{bmatrix}^T$$

$$D_{1\times 1} = 1$$

If $-a_p$ and $-a_{p+1}$ constitute a complex conjugate pair of poles (i.e. $-a_{p+1}=-a^*_p$), a real-valued state-space expression is obtained by replacing the portion $$\frac{s-(z_{p,d}^{(t-1)})^*}{s+z_{p,d}^{(t-1)}} \to \frac{s-(z_{p+1,d}^{(t-1)})^*}{s+z_{p+1,d}^{(t-1)}} \quad (24)$$

in the cascade scheme (22) by $$\frac{(s-(z_{p,d}^{(t-1)})^*)(s-(z_{p+1,d}^{(t-1)})^*)}{(s+z_{p,d}^{(t-1)})(s+z_{p+1,d}^{(t-1)})} = 1 + \frac{4\mathrm{Re}(-z_{p,d}^{(t-1)})s}{(s+z_{p,d}^{(t-1)})(s+(z_{p+1,d}^{(t-1)})^*)} \quad (25)$$

This corresponds to replacing $$\begin{pmatrix} -z_{p,d}^{(t-1)} & 0 \\ 2\mathrm{Re}(-z_{p,d}^{(t-1)}) & -z_{p+1,d}^{(t-1)} \end{pmatrix} \quad (26)$$

in the state matrix A by $$\begin{pmatrix} \mathrm{Re}(-z_{p,d}^{(t-1)}) & \mathrm{Re}(-z_{p,d}^{(t-1)}) - |z_{p,d}^{(t-1)}| \\ \mathrm{Re}(-z_{p,d}^{(t-1)}) + |z_{p,d}^{(t-1)}| & \mathrm{Re}(-z_{p,d}^{(t-1)}) \end{pmatrix} \quad (27)$$

The other state-space matrices remain unchanged.

Figure 3:
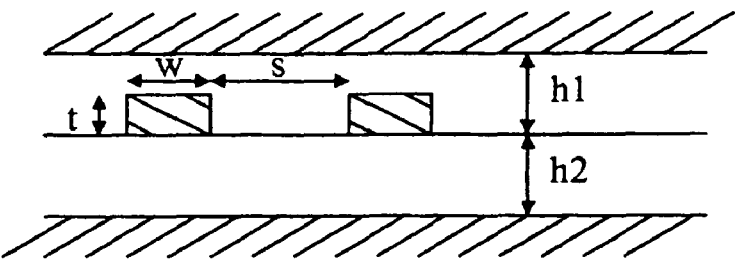
FIG. 3 shows key parameters of coupled dispersive striplines to be modelled by the apparatus of FIG. 1.
Figure 4:
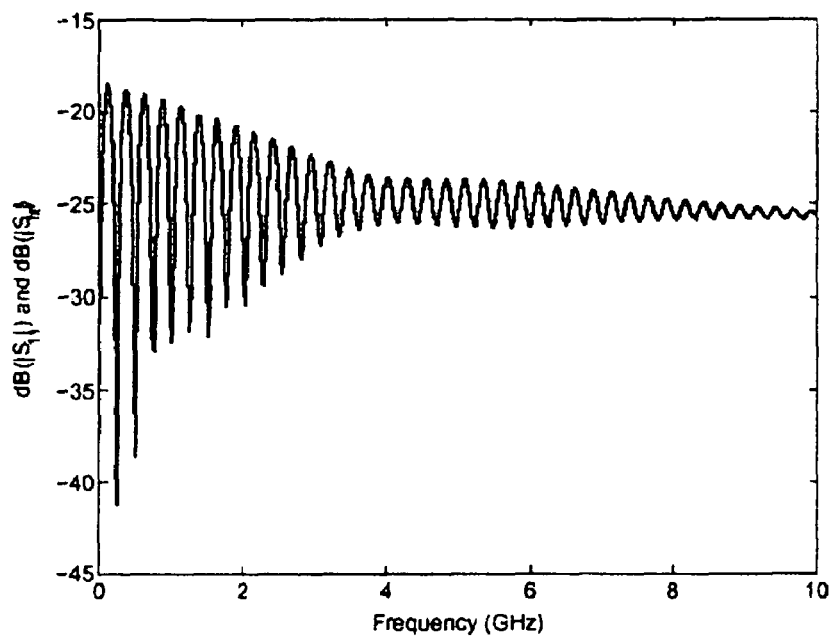
FIG. 4 is a graph showing variation of reflection coefficient with frequency for the coupled dispersive striplines of FIG. 3.

An example of a procedure in accordance with the invention will be given in the context of dispersive striplines, to model the reflection coefficient $S_{11}$ of two symmetric coupled dispersive striplines lying between two lossy substrate layers. The striplines have length=13000 mil (1 mil=0.001 inch=0.0254 mm), width w=7.501 mil, spacing s=9.502 mil, thickness t=0.36 mil and conductivity=5.8*10$^7$ S/m; the first substrate has height h1=13.9 mil, dielectric constant $\in_r$=4.2 and loss factor tg $\delta$=0.024; and the second substrate has height h2=5.24 mil, dielectric constant $\in_r$=2.6 and tg $\delta$=0.004. FIG. 3 shows the structure and FIG. 4 shows the magnitude of the spectral response over the frequency range of interest (50 Hz to 10 GHz).

Figure 2:
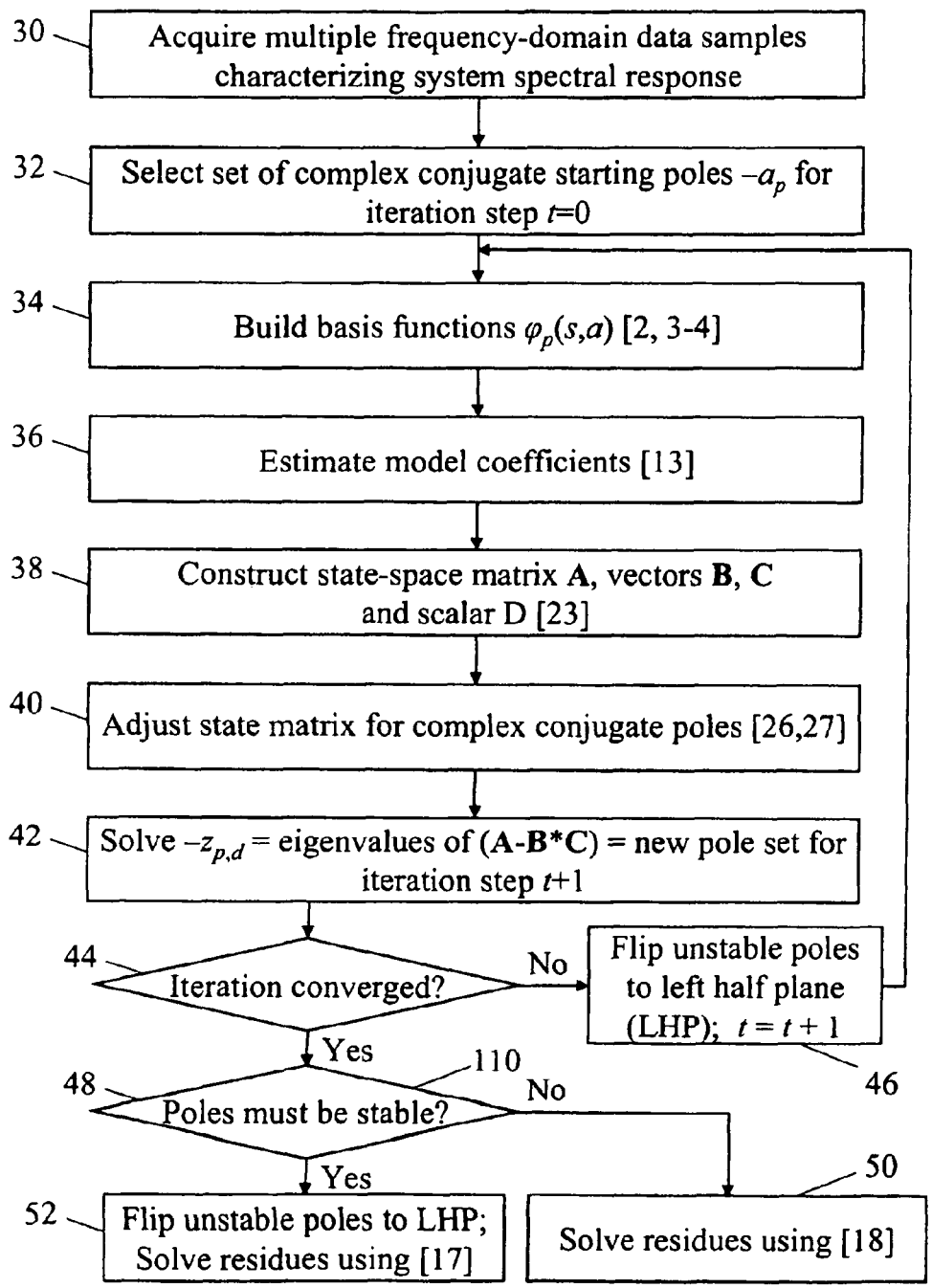
FIG. 2 is a flow chart of a procedure implemented in the apparatus of FIG. 1.

Referring to FIG. 2, in order to create a frequency-domain macro-model of these coupled dispersive striplines, at stage 30 multiple frequency-domain data samples characterizing the spectral response of the striplines are obtained, by simulations performed with an electromagnetic simulator. This kind of simulator provides accurate data values at one frequency per data point, and requires extensive computational resources. The macro-model (transfer function) created by the invention enables the striplines to be modelled over a much larger frequency range (in the limit from d.c. to infinity), using transient (or circuit) simulation techniques requiring less extensive computational resources.

At stage 32 a set of complex conjugate starting poles is chosen. The poles are selected to be close to, but not on the imaginary axis of the complex plane, in the (negative) LHP, and distributed uniformly over the complete frequency range of interest. The number of poles is chosen in accordance with the complexity of the structure to be modelled. A convenient starting number in the absence of specific knowledge or experience is a low number of four poles; subsequent trials can be conducted with five, six or more poles to establish if a superior macro-model results. Thus the poles are selected to be $$-a_p=-a+\beta i, \quad -a_{p+1}=-a-\beta i \quad (28)$$

$$a=\beta/100 \quad (29)$$

with imaginary parts $\beta$ covering the frequency range of interest (scaled in GHz).

At stage 34 the weighted linear cost function (7) is solved using the orthonormal rational basis functions (2) or (3) and (4), and at stage 36 the model coefficients $d_p^{(t)}$ and $\tilde{d}_p^{(t)}$ are estimated using expression (13).

At stage 38 the minimal state-space formulation (A, B, C, D) of the denominator in expression (21) is calculated, according to expression (23). The state matrix A is adjusted at stage 40 for the presence of complex conjugate poles, i.e. by replacing terms of the form of expression (26) with terms of the form of expression (27). From the state-space model the poles $-z^{(t)}_{p,d}$ of the transfer function R(s) are calculated at stage 42, by solving the eigenvalues of (A−B*C). These new pole values constitute candidate poles for a following cycle of the iteration.

At stage 44 a test is performed of whether the iteration has converged to a result of the required accuracy. This can be accomplished for example by comparing the model and the measured data to determine if they match to a required degree of accuracy, such as an error <0.1%. In practice the procedure may be expected to converge in 3 to 5 iterations, for models comprising up to 120 poles.

If the iteration has not converged sufficiently, then at stage 46 any unstable poles (poles with a positive real component) are "flipped" into the LHP, that is mirrored about the imaginary axis. Then the procedure returns to stage 34 for another cycle of the iteration.

When the test at stage 46 determines that sufficient convergence has been achieved, the procedure advances to stage 50, to check whether or not unstable poles are acceptable in the final result. If unstable poles are acceptable, then the residues of the transfer function R(s) are solved in accordance with expression (18), at stage 50. Typically only stable poles will be preferred, in which case the procedure first flips any unstable poles into the LHP, at stage 52, before solving the residues of the transfer function R(s) in accordance with expression (17).

Figure 5:
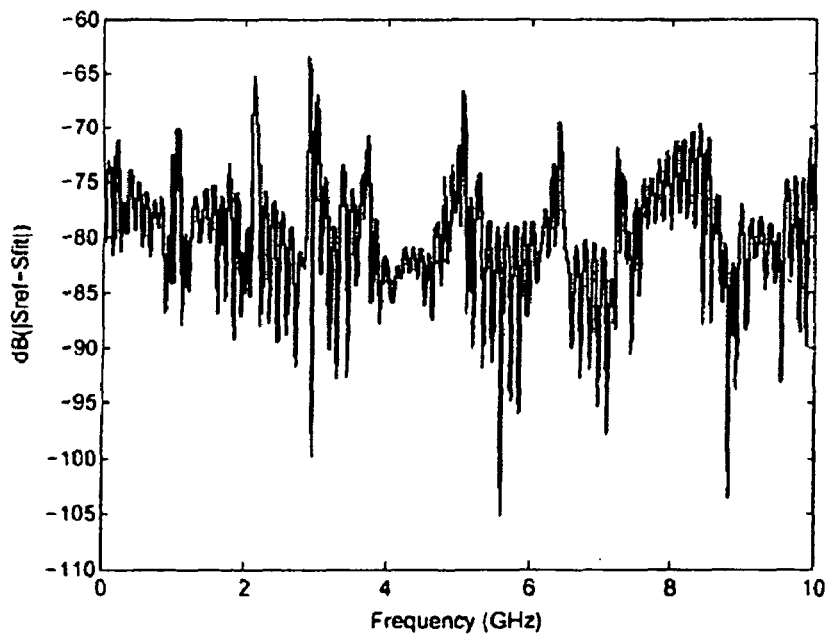
FIG. 5 is a graph showing accuracy of a macro-model, derived in accordance with the present invention, of the coupled dispersive striplines of FIG. 3.

In the example shown in FIGS. 3 and 4, the number of poles was set equal to 86, and the model was approximated by an improper transfer function in a least-squares sense, using four S-K iteration cycles. The final accuracy of the model is shown in FIG. 5, and the maximum error corresponds to −63 dB, which is quite close to the numerical noise level of the simulator used.

The above description has shown how the invention can be implemented with frequency-domain data. The invention is also applicable to time-domain data, as explained below. In the following description, time-domain functions are denoted by lower-case letters, such as input signal u(t), output signal y(t) and impulse response h(t). As in the description above, upper-case letters are used for frequency-domain functions, such as input spectrum U(s), output spectrum Y(s) and frequency response H(s). The symbol 't' represents the time-domain variable, while the italicised symbol '$t$' represents the iteration count of the iterative algorithm. The two domains are related by the Laplace transform:

$$F(s) = (\mathcal{L}f)(s) = \int_0^\infty f(t)e^{-st}dt \quad (30)$$

Only rational functions with poles in the LHP are considered. The inverse Laplace transform for such functions is given by:

$$f(t) = (\mathcal{L}^{-1}F)(t) = \frac{1}{2\pi i}\int_{iR} F(s)e^{st}\,ds \quad (31)$$

Reconstruction of the time-domain transfer function is based on time-domain data $(t_k, u(t_k), y(t_k))$. To rewrite expression (13) in terms of the signals u(t) and y(t), the inverse Laplace transform is taken, yielding $$\sum_{p=1}^{P} \varphi_p(t_k, z_d^{(t-1)}) * u(t_k) d_p^{(t)} - \sum_{p=1}^{P} \varphi_p(t_k, z_d^{(t-1)}) * y(t_k) \tilde{d}_p^{(t)} = y(t_k) \quad (32)$$

where $\phi_p(t)$ is the inverse Laplace transform of $\phi_p(s)$, and $f(t) \star g(t)$ represents the convolution of $f(t)$ and $g(t)$. Applying this equation to the time-domain data samples leads to a system of equations in the coefficients $d_p^{(t)}$ and $\tilde{d}_p^{(t)}$ that can be solved to evaluate those coefficients. Expression (32) is the time-domain counterpart of expression (13).

Apart from these modified expressions, the time-domain implementation of the invention is performed in a manner analogous to the frequency-domain version described above. Initial poles $\{-a_p^{(0)}\}$ are chosen, and are updated in an iterative procedure solving expression (32), until convergence is reached at an acceptable degree of accuracy, say with poles $\{-a_p^{(T)}\}$ (i.e. after T iteration steps).

Next, the least-squares system of equations $$\sum_{p=1}^{P} \varphi_p(t_k, z_d^{(T)}) * u(t_k) \alpha_p^{(T)} = y(t_k) \quad (33)$$

where $\phi_p^{(t)}(t)$ is the inverse Laplace transform of $\phi_p(s)$, is solved for the time-domain data $\{(t_k, u(t_k), y(t_k))\}$. This representation leads as before to a state-space expression for the approximated system.

To consider orthogonality in the time domain, the time domain scalar product is defined as $$<f,g>_t = \int_0^\infty f(t)g(t)dt \quad (34)$$

It can be shown that the relevant time-domain orthogonal functions $\phi_p(t)$ are given by the inverse Laplace transform of $\phi_p^{(t)}(s)$ in expression (2) for real poles, or expressions (3) and (4) for complex conjugate pairs of poles. No explicit expression is available for the orthogonal basis functions $\phi_p(t)$, but this is of no consequence. Expressions (32) and (33) for time-domain vector fitting only require the convolution of these functions with the signals u(t) and y(t). Accordingly a state-space formulation of these convolutions with $\phi_p(t)$, or, equivalently, of the transfer functions $\phi_p^{(t)}(s)$, can be excited with u(t) or y(t) at the input to obtain the required convolutions. This process is described below.

To compute the convolutions in expressions (32) and (33), a state-space formulation of the rational functions $\phi_p^{(t)}(s)$ is used. Standard simulation algorithms enable these computations to be done in a numerically stable way. A state-space formulation of the approximate model is available, which facilitates post-processing of the model.

The construction is based on cascading a number of small state-space models. By cascading these models, a P-dimensional state-space model is obtained with matrices A, B, C and D as described defined in expression (23). Standard techniques can then be applied to compute the zeroes of this transfer function, or to post-process the state-space representation of the approximate model.

As complex poles occur in conjugated pairs, the state-space formulation can be implemented in real arithmetic. To this end, the blocks in expression (22), corresponding to a complex conjugated pair of poles are combined, say ($-a_p$, $-a_{p+1} = -a^*_p$). As a consequence, a state-space formulation with guaranteed real coefficients is obtained by replacing expression (26) with expression (27) in the matrix A for every pair ($-a_p$, $-a_{p+1}$) of complex conjugated poles.

The orthogonalization applied above is only one of many orthogonalizations that can be used. For example, a scalar product different from expression (34) could be considered, or the basis of rational functions $\{\phi_p(s)\}$ in expressions (1) or (2) could be made different in the numerator and denominator.

Figure 6:
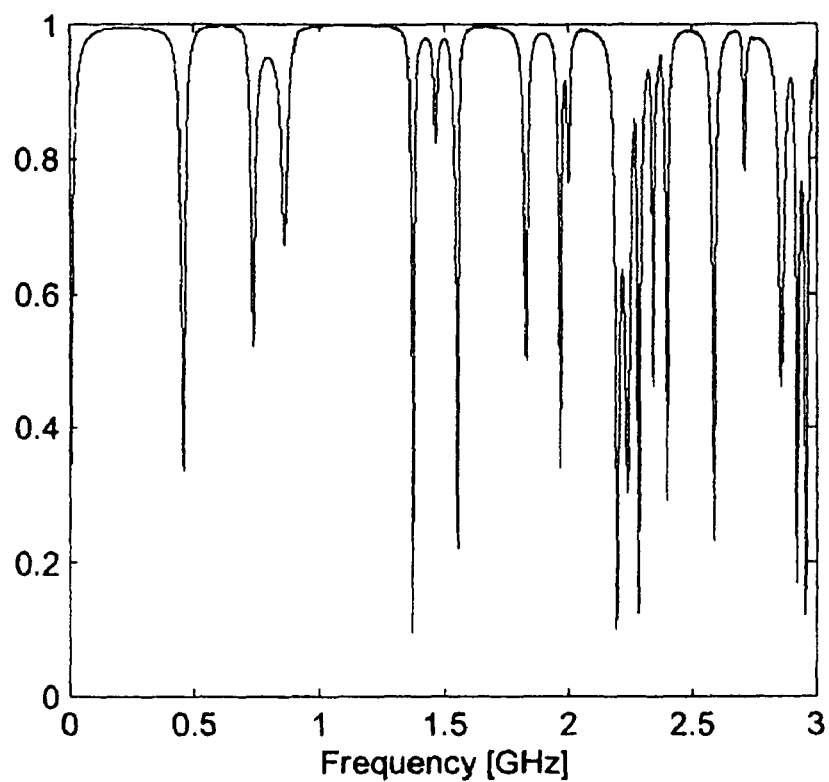
FIG. 6 is a graph showing the frequency response of a second system to be modelled by the apparatus of FIG. 1.
Figure 7:
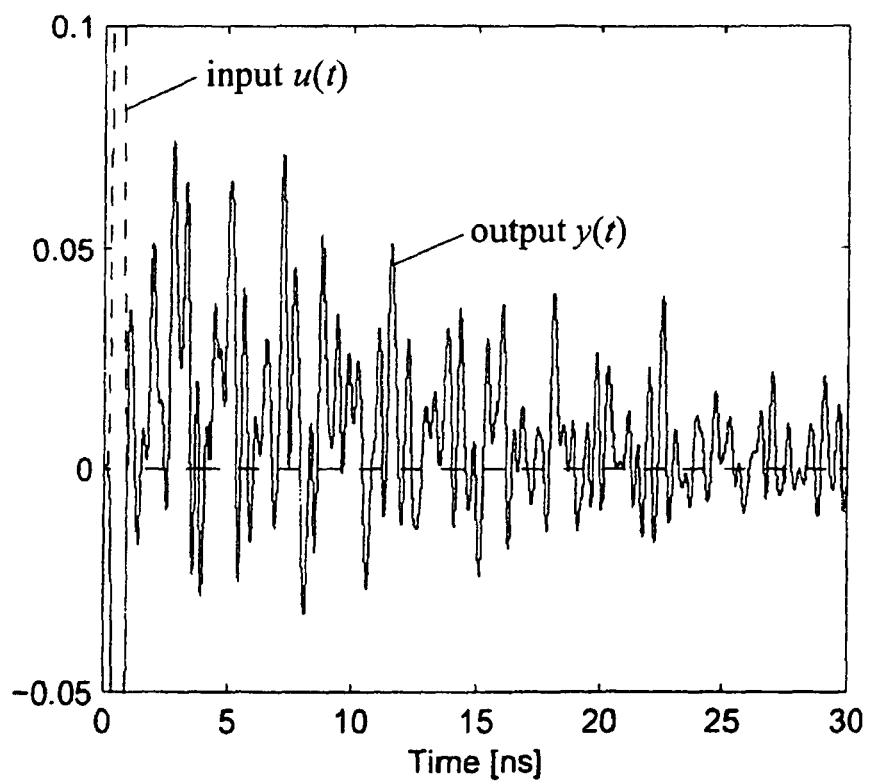
FIG. 7 is a graph of the time-domain transient response of the second system.
Figure 8:
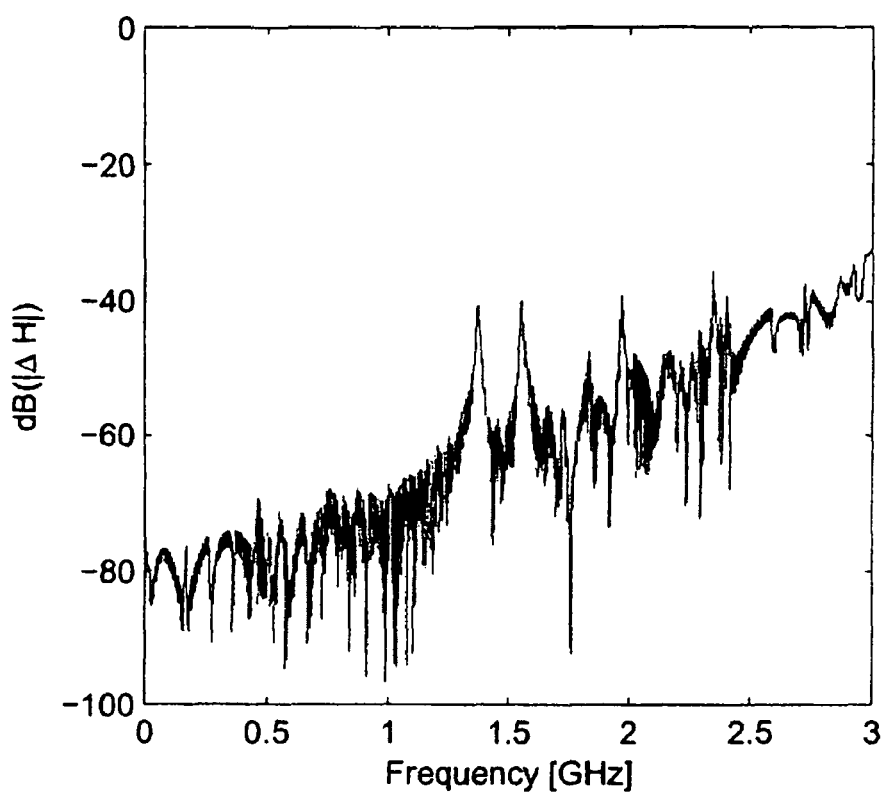
FIG. 8 shows accuracy of a macro-model, derived in accordance with the present invention, of the second system.

An example of implementation of the invention in the time domain using orthonormal rational functions involves a system with frequency response as shown in FIG. 6. A Gaussian pulse at the input (centered at t=0.6 ns, with a width of 0.2 ns and a height of 1 in normalized units) results in the transient response shown in FIG. 7 (11,180 samples, sampling time of 10 ps). The order of the approximate model was P=120. The initial poles were chosen as complex conjugated pairs with constant real part and with imaginary part linearly distributed over the frequency range (0-3 GHz). One iteration step of the algorithm was computed (expression (32)), after which the transient and frequency response were reconstructed (expression (33) and using the state-space formulation described above with reference to expressions (22) to (27). FIG. 8 shows the error as a function of frequency for $\text{Re}(-a_p)=-2*10^9$.

The examples described above have involved either frequency-domain or time-domain operations alone. In certain circumstances it may be desirable to mix frequency-domain and time-domain data in creating a single macro-model. The invention can likewise be applied to such hybrid situations, involving the use of frequency-domain and time-domain data simultaneously, as the equations are the same in either domain.

What is claimed is:

1. A method of generating a broadband transfer function of complex characteristics of a linear time-invariant system within an apparatus, comprising:
   using a user input/output interface unit to acquire measured data characterising properties of the system;
   using a processing unit having a central processing unit and a memory to define a set of poles in the complex plane to characterise the system;
   using the processing unit to iteratively perform the following:
      define a set of orthonormal rational basis functions incorporating the defined poles,
      use the orthonormal rational basis functions to estimate transfer function coefficients, and
      derive revised values for the complex poles,
   until a desired level of accuracy of the transfer function coefficients is attained;
   using the revised complex poles to determine parameters of the broadband transfer function with the processing unit; and
   using the broadband transfer function to identify a mapping between inputs and outputs of the time invariant system.

2. The method of claim 1, wherein the revised values of the complex poles are derived by constructing a state-space representation (A, B, C, D), and solving for the eigenvalues of the expression (A−B*C), wherein A represents a state matrix, B represents an input matrix, C represents an output matrix and D represents a feedforward term.

3. The method of claim 2, wherein the state matrix A is adjusted with the processing unit for the presence of complex conjugate poles.

4. The method of claim 2, wherein the state-space representation comprises the following components:

$$A_{P \times P} = \begin{bmatrix} -z^{(t-1)}_{1,d} & 0 & 0 & \ldots & 0 \\ 2\text{Re}(-z^{(t-1)}_{1,d}) & -z^{(t-1)}_{2,d} & 0 & \ldots & 0 \\ 2\text{Re}(-z^{(t-1)}_{1,d}) & 2\text{Re}(-z^{(t-1)}_{2,d}) & -z^{(t-1)}_{3,d} & \ldots & 0 \\ 2\text{Re}(-z^{(t-1)}_{1,d}) & 2\text{Re}(-z^{(t-1)}_{2,d}) & 2\text{Re}(-z^{(t-1)}_{3,d}) & \ldots & 0 \\ \ldots & \ldots & \ldots & \ldots & \ldots \\ 2\text{Re}(-z^{(t-1)}_{1,d}) & 2\text{Re}(-z^{(t-1)}_{2,d}) & 2\text{Re}(-z^{(t-1)}_{3,d}) & \ldots & -z^{(t-1)}_{P,d} \end{bmatrix}$$

$$B_{1 \times P} = \begin{bmatrix} 1 \\ 1 \\ \ldots \\ 1 \end{bmatrix}, \quad C_{P \times 1} = \begin{bmatrix} \tilde{d}^{(t)}_1 \sqrt{2\text{Re}(z^{(t-1)}_{1,d})} \\ \tilde{d}^{(t)}_2 \sqrt{2\text{Re}(z^{(t-1)}_{2,d})} \\ \ldots \\ \tilde{d}^{(t)}_P \sqrt{2\text{Re}(z^{(t-1)}_{P,d})} \end{bmatrix}^T$$

$$D_{1 \times 1} = 1$$

where P is the number of poles used in defining the basis functions, Re represents the real part of a complex value, $z^{(t)}_d = \{-z^{(t)}_{1,d}, \ldots, -z^{(t)}_{P,d}\}$ are elements of an array of complex zeroes at iteration step t, and $\tilde{d}^{(t)}_p$ are transfer function coefficients.

5. The method of claim 4, wherein the state matrix A is adjusted for the presence of complex conjugate poles with the processing unit by replacing $$\begin{pmatrix} -z^{(t-1)}_{p,d} & 0 \\ 2\text{Re}(-z^{(t-1)}_{p,d}) & -z^{(t-1)}_{p+1,d} \end{pmatrix}$$

in the state matrix A by $$\begin{pmatrix} \text{Re}(-z^{(t-1)}_{p,d}) & \text{Re}(-z^{(t-1)}_{p,d}) - |z^{(t-1)}_{p,d}| \\ \text{Re}(-z^{(t-1)}_{p,d}) + |z^{(t-1)}_{p,d}| & \text{Re}(-z^{(t-1)}_{p,d}) \end{pmatrix}.$$

6. The method of claim 1, wherein the data characterising properties of the system are frequency-domain data.

7. The method of claim 1, wherein the data characterising properties of the system are time-domain data.

8. The method of claim 1, wherein some of the data characterising properties of the system are frequency-domain data and additional data characterising properties of the system are time-domain data.

9. The method of claim 1, wherein the system is an electromagnetic system.

10. The method of claim 1, wherein the system comprises an individual component.

11. An apparatus comprising:
   a memory storing software program instructions for generating a broadband transfer function of complex characteristics of a linear time-invariant system;
   a processing unit having a central processing unit and the memory, the processing unit configured to implement procedures for generating the broadband transfer function of complex characteristics of the linear time-invariant system according to the stored software program instructions; and
   a user input/output interface unit configured for acquiring measured data characterising properties of the linear time-invariant system;
   the processing unit further configured to, according to the stored software program instructions:
      define a set of poles in the complex plane to characterise the system with a processing unit; and
      iteratively:
         define a set of orthonormal rational basis functions incorporating the defined poles,
         use the orthonormal rational basis functions to estimate transfer function coefficients, and
         derive revised values for the complex poles,
      until a desired level of accuracy of the transfer function coefficients is attained;
      use the revised complex poles to determine parameters of the broadband transfer function; and
      use the broadband transfer function to identify a mapping between inputs and outputs of the time invariant system.

* * * * *